(12) United States Patent
Hippin et al.

(10) Patent No.: US 10,237,982 B2
(45) Date of Patent: Mar. 19, 2019

(54) SOLDER APPLICATION STAMP FOR APPLYING SOLDER ON CONTACT LOCATIONS POSSESSING SMALL DIMENSIONS

(71) Applicant: Endress + Hauser GmbH + Co. KG, Maulburg (DE)

(72) Inventors: Christoph Hippin, Grenzach-Wyhlen (DE); Jenny Schone, Zell-Gresgen (DE)

(73) Assignee: ENDRESS+HAUSER SE+CO.KG, Maulburg (DE)

(*) Notice: Subject to any disclaimer, the term of this patent is extended or adjusted under 35 U.S.C. 154(b) by 140 days.

(21) Appl. No.: 15/035,536

(22) PCT Filed: Sep. 30, 2014

(86) PCT No.: PCT/EP2014/070938
§ 371 (c)(1),
(2) Date: May 10, 2016

(87) PCT Pub. No.: WO2015/067413
PCT Pub. Date: May 14, 2015

(65) Prior Publication Data
US 2016/0353583 A1    Dec. 1, 2016

(30) Foreign Application Priority Data
Nov. 11, 2013    (DE) .................. 10 2013 112 348

(51) Int. Cl.
*B23P 19/00*    (2006.01)
*H05K 3/34*    (2006.01)
(Continued)

(52) U.S. Cl.
CPC ............ *H05K 3/341* (2013.01); *B23K 1/0016* (2013.01); *B23K 3/0638* (2013.01); *H05K 3/225* (2013.01);
(Continued)

(58) Field of Classification Search
CPC ..... B29C 2033/426; B29C 33/42; B41K 1/02; Y10T 29/49805; Y10T 29/53174; Y10T 29/53678; Y10T 29/53943; H05K 1/0393
(Continued)

(56) References Cited

U.S. PATENT DOCUMENTS 4,594,961 A    6/1986    Beris
5,676,305 A    10/1997    Potter
(Continued)

FOREIGN PATENT DOCUMENTS

CN    101269431 A    9/2008
CN    101961825 A    2/2011
(Continued)

OTHER PUBLICATIONS

German Search Report, German Patent Office, Munich, DE, Oct. 21, 2014.
(Continued)

*Primary Examiner* — Thiem Phan
(74) *Attorney, Agent, or Firm* — Bacon & Thomas, PLLC

(57) ABSTRACT

A solder application stamp embodied to transfer solder paste from a reservoir to a contact location of a circuit board. The solder stamp has a basic body having an end area and a protrusion, which protrudes out of the end area. The solder application to create solder paste dots of diameters as small as 10-300 μm.

9 Claims, 3 Drawing Sheets

(51) Int. Cl.
 *H05K 3/22* (2006.01)
 *B23K 1/00* (2006.01)
 *B23K 3/06* (2006.01)
 *H05K 13/00* (2006.01)
 *H05K 3/12* (2006.01)

(52) U.S. Cl.
 CPC ....... *H05K 3/3484* (2013.01); *H05K 13/0015* (2013.01); *H05K 13/0069* (2013.01); *H05K 3/1275* (2013.01); *H05K 3/3431* (2013.01); *H05K 2203/0195* (2013.01); *H05K 2203/0338* (2013.01); *H05K 2203/176* (2013.01); *Y10T 29/53174* (2015.01)

(58) Field of Classification Search
 USPC .................................. 29/739, 729, 740, 840
 See application file for complete search history.

(56) References Cited

U.S. PATENT DOCUMENTS

| | | | |
|---|---|---|---|
| 5,909,839 A | 6/1999 | Belke | |
| 5,951,480 A | 9/1999 | White | |
| 5,953,969 A * | 9/1999 | Rosenhan | B25B 15/001 81/436 |
| 6,193,143 B1 | 2/2001 | Ishikawa | |
| 8,250,722 B2 | 8/2012 | Xia | |
| 2011/0016687 A1 | 1/2011 | Xia | |

FOREIGN PATENT DOCUMENTS

| | | |
|---|---|---|
| DE | 2134195 | 1/1973 |
| DE | 19910173 A1 | 9/2000 |
| DE | 102007041960 B3 | 5/2009 |
| EP | 0145075 A2 | 6/1985 |
| JP | 3167891 A | 7/1991 |

OTHER PUBLICATIONS

International Search Report, EPO, The Netherlands, Dec. 8, 2014.
English Translation of the International Preliminary Report on Patentability, WIPO, Geneva, CH, May 26, 2016.

* cited by examiner

SOLDER APPLICATION STAMP FOR APPLYING SOLDER ON CONTACT LOCATIONS POSSESSING SMALL DIMENSIONS

TECHNICAL FIELD

The invention relates to a method for repairing a circuit board having at least one defective component, to a solder application stamp, to a use of the solder application stamp and to an automated plant.

BACKGROUND DISCUSSION

Known from the manufacture of circuit boards are various methods for populating the circuit boards. For example, so-called SMD components (Surface Mounted Device) are mounted on contact surfaces on the front side of the circuit board. THT (Through Hole Technology) components, in contrast, possess connection wires, which pass through an opening in the circuit board and are secured on the oppositely lying side of the circuit board. A mixed populating with SMD and THT components is also possible. The soldering of SMD components occurs, as a rule, in a reflow process. For preparing for this, the circuit board is provided with solder paste at the locations to be populated. This forms solder paste depositions. Then, components are positioned on corresponding solder depositions. The so populated circuit board is exposed to a heat source, for example, placed on a heating plate or fed to a soldering oven, wherein the solder paste melts, whereby a connection of the component with the circuit board is produced.

It can occur that components are defective or stop working in the course of operation. Especially in the case of high cost components or in the case of assemblies with a plurality of components, the complete assembly is not disposed of, but, instead, the one or more defective components are replaced. When a component is removed, as a rule, solder remains, which, however, is not sufficient as solder paste deposition for the securement of the substitute component. Therefore, a subsequent applying of an individually to be determined solder amount onto the circuit board, respectively the carrier or the component, is required. Since the surfaces, respectively the contact locations, on which the solder paste is to be applied, are often very small, an applying of the solder paste according to one of the conventional methods, such as, for example, stencil printing, respectively solder paste printing, is no longer possible. Since the openings in the stencil required for these methods are clearly too small, no solder paste, respectively insufficient solder paste, can be released from the openings of the stencil and, thus, transferred onto the pad, respectively the contact location. Thus, it is not possible to print contact locations, which have, for example, a dimension of 470 μm to 160 μm, with a conventional solder paste of class type 3 or type 4, since the ball sizes of the solder paste of these classes are too large.

An alternative method for stencil printing, respectively solder paste printing, is that where the dispensing technology is by means, for example, of a syringe, respectively cartridge, wherein this method likewise reaches its limits as regards the ball sizes. Typically, the diameters of the solder paste dots dispensed with this method lie at about 300 to 500 μm.

Furthermore, it is known to print solder paste dots by means of jet printing contactlessly on the contact locations. In such case, solder paste deposits with a minimum diameter of about 300 μm can be produced. Smaller diameters are likewise difficult to implement with this technology.

Likewise known from the state of the art is to dunk components, respectively their contact locations, which are to be mounted on a circuit board, in a tub of appropriate depth filled with flux and/or solder paste, in order so to wet the contact locations with flux and/or solder paste. After the pull out of the component from the tub, the contact locations, thus, have flux and/or solder paste for the soldering process. This method works, however, only in the case of components, which have projecting, respectively protruding, contact locations, for example, in the form of balls, pins, etc.

SUMMARY OF THE INVENTION

An object of the invention, therefore, is to enable the soldering of components, which have no projecting, respectively protruding, contact locations and the contact locations supplementally possess very small dimensions.

The object is achieved by a method, by a solder application stamp, by a use of the solder application stamp and by an automated plant.

As regards the method, the object is achieved by a method for repairing a circuit board having at least one defective component, wherein the defective component is connected via at least one circuit board side, contact location mechanically and/or electrically with the circuit board, wherein the method at least includes steps as follows:

removing the defective component from the circuit board;
cleaning the at least one circuit board side, contact location;
applying a solder paste on the at least one cleaned circuit board side, contact location by means of a solder application stamp, wherein the solder application stamp first in a wetting step is brought at least partially into a reservoir with solder paste for wetting with the solder paste and then the wetted solder application stamp in a transfer step is brought onto the desired circuit board side, contact location, so that solder paste is applied, respectively transferred, onto the at least one circuit board side, contact location;
populating the circuit board with a substitute component previously provided for the defective component; and
soldering the substitute component onto the at least one desired circuit board side, contact location.

According to the invention, the object is thus achieved by using for applying the solder paste a specially embodied solder application stamp, via which the solder paste is transferred to the contact locations of the circuit board, in order so to be able to generate solder paste dots of 10 μm to 300 μm diameter.

A further advantage of the method of the invention provides that it is likewise possible to transfer solder paste into solder depots, thus cavities, which the circuit board has. This is only very conditionally possible with the conventional methods, such as, for example, stencil printing.

Furthermore, the method offers an increased flexibility, since it not such as in the case of stencil printing limited by the manufacture of a stencil needed for the specific circuit board. Moreover, with the method of the invention, smaller distances between two contact locations to be wetted with solder paste can be implemented.

In an advantageous form of embodiment, the method provides that the wetting step is executed under force control, so that the solder application stamp is only inserted into the reservoir up to a predefined first force.

In an additional advantageous form of embodiment, the method provides that the transfer step is executed under force control, so that the wetted solder application stamp only pushed against the at least one circuit board side, contact location up to a predefined second force.

In an additional advantageous form of embodiment, the method provides that the cleaning of the circuit board side, contact locations is performed contactlessly.

As regards the solder application stamp, the object is achieved by solder application stamp for transferring solder paste from a reservoir to a contact location of a circuit board, wherein the solder application stamp includes:
a basic body having an end area;
at least one protrusion, which protrudes out of the end area and has a protrusion area, wherein the protrusion in longitudinal section has an at least sectionally concave contour between the end area and the protrusion area.

An advantageous embodiment of the solder application stamp provides that the protrusion area extends essentially parallel to the end area of the basic body.

An advantageous embodiment of the solder application stamp provides that the protrusion area is so embodied that the ratio of the end area to the protrusion area corresponds at most to a factor of 10, preferably a factor of 7.5, especially preferably a factor of 5.

An alternative embodiment of the solder application stamp provides that the protrusion area is so embodied that the ratio of the end area to the protrusion area corresponds at most to a factor of 35, preferably a factor of 21, especially preferably a factor of 15.

An advantageous embodiment of the solder application stamp provides that the maximum distance between the end area and the protrusion area and, thus, the height of the protrusion lies in the range of 50-250 µm, preferably in the range of 80-150 µm.

An alternative embodiment of the solder application stamp provides that the maximum distance between the end area and the protrusion area and, thus, the height of the protrusion lies in the range of 50-400 µm, preferably in the range of 180-220 µm, especially preferably in the range of 280-320 µm.

An advantageous embodiment of the solder application stamp provides that the protrusion area has a diameter in the range of 300-180 µm, preferably in the range of 180-130 µm, especially preferably in the range of 130-50 µm.

Another advantageous embodiment provides that the solder application stamp further includes a hydrophobic coating, which is applied on the basic body at least in a region adjoining the protrusion.

As regards the use, the object is achieved by a use of the solder application stamp according to one of the preceding embodiments for repairing a circuit board having at least one defective component.

As regards the automated plant, the object is achieved by an automated plant for repairing a circuit board, which has at least one defective component, wherein the automated plant at least includes:
a solder application stamp as described in one of the preceding embodiments;
an automatic positioning unit, to which the solder application stamp is mounted, in order to enable an automatic positioning, respectively movement, of the solder application stamp;
a circuit board holding unit, which relative to the positioning unit enables an automatic positioning of a circuit board provided in the circuit board holding unit.

An advantageous embodiment of the automated plant of the invention provides that the positioning unit enables a force controlled movement, especially a force controlled settling, of the solder application stamp secured on the positioning unit.

BRIEF DESCRIPTION OF THE DRAWINGS

The invention will now be explained in greater detail based on the appended drawing, the figures of which show as follows.

FIG. 1 shows a flow diagram of the method of the invention.

Figure 1:
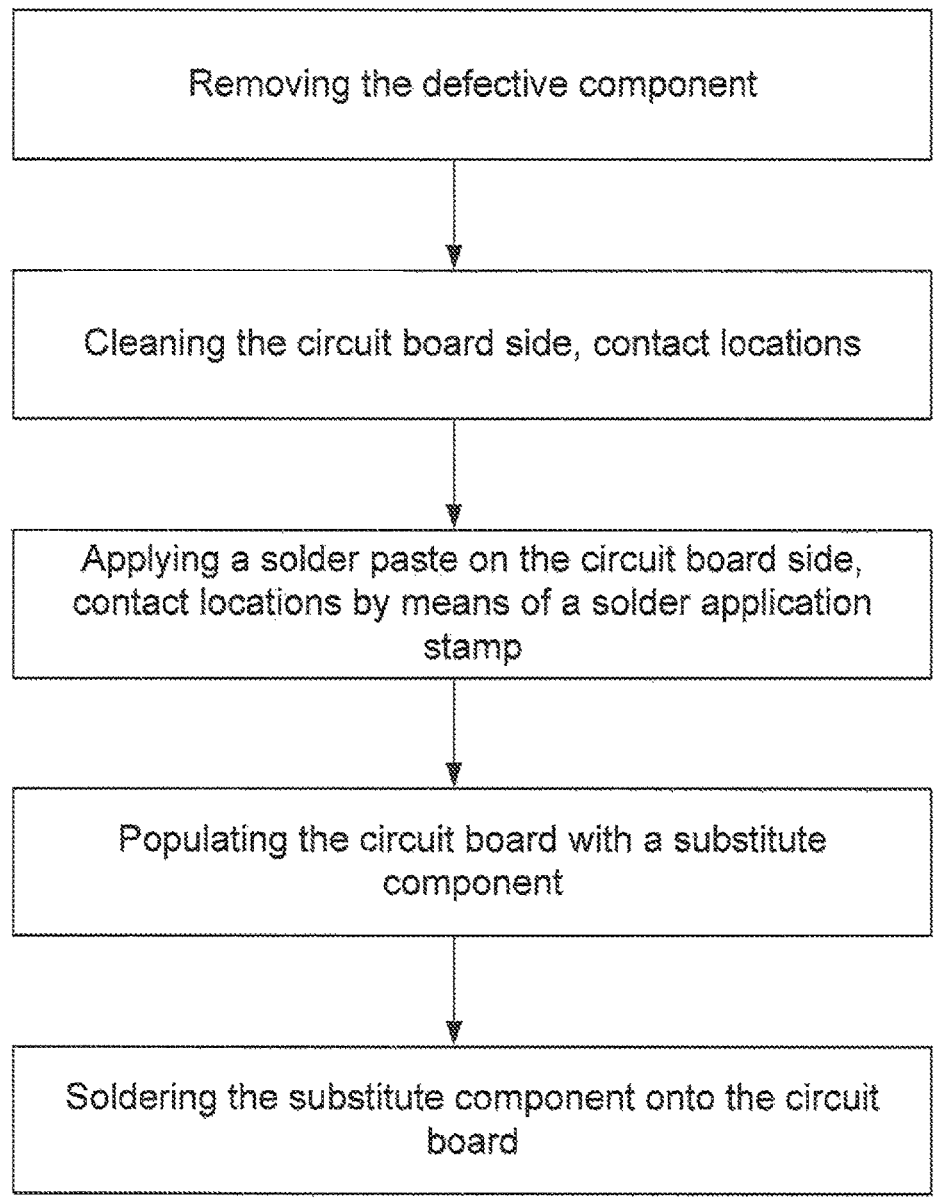
FIG. 1 is a flow diagram of the method of the invention.
Figure 2A:
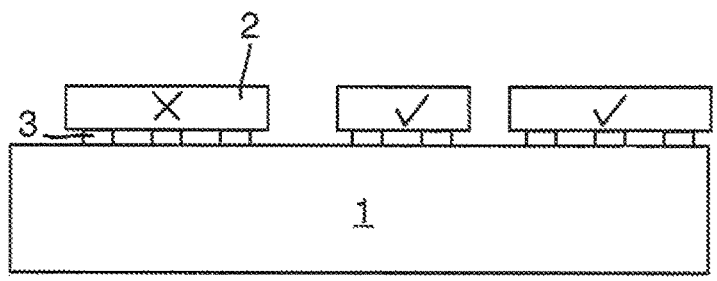
FIG. 2 is a schematic drawing illustrating the method steps.
Figure 2B:
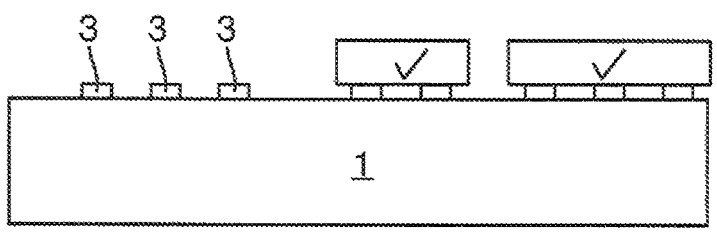
Figure 2C:
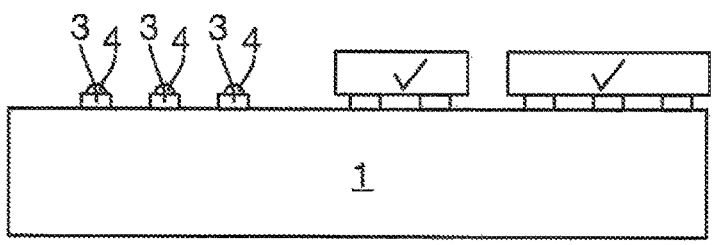
Figure 2D:
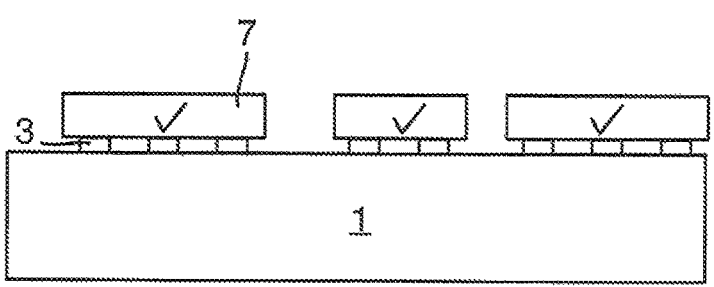

In the first step, the defective component 2, which is secured via contact locations 3 mechanically and/or electrically on the circuit board 1, is removed. For this, the circuit board 1 is clamped into an automated plant, which has a circuit board holding unit. Preferably, the circuit board holding unit includes a facility for heating from underneath. This enables a preheating of the total circuit board 1. For removing the defective component 2 still soldered onto the circuit board 1, the automated plant is equipped with a multi-channel ring jet. The multi-channel ring jet is, in such case, embodied in such a manner that it, on the one hand, emits hot air and, on the other hand, can draw a vacuum, respectively air. In this way, the solder between the contact locations 3 of the defective component 2 and the contact locations 3 the circuit board 1 can be melted by means of the hot air. The size of the multi-channel ring jet is, in such case, dependent on the component size and is so selected that an essentially complete heating of the defective component 2, respectively the contact locations 3, occurs. After the solder 4 is melted, the defective component 2 is sucked in by means of the vacuum function of the multi-channel ring jet and the component 2 released from the circuit board 1.

Preferably, in an intermediate step, it is provided that before additional working of the circuit board 1, there is a waiting period, until the automated plant and, thus, also the circuit board 1 have cooled off. Alternatively, the circuit board 1 can be further processed in an already cooled, second automated plant.

In the second step, all circuit board side, contact locations 3, which have served for bonding the defective component 2 to the circuit board 1, are cleaned. Preferably, this cleaning occurs contactlessly. For this, the automated plant is equipped with a multi-channel cleaning jet. The multi-channel cleaning jet is, in turn, embodied in such a manner that it, on the one hand, emits hot air and, on the other hand, can draw a vacuum, respectively air, wherein the sucked air is conducted by a bypass through a filter. The contact locations 3 are visited by means of the multi-channel cleaning jet, wherein the hot air heats the remaining solder still present after removing the defective component 2, so that the solder can then be removed.

In the third step, a solder paste 4 is applied on the cleaned circuit board side, contact locations 3. For this, the automated plant is equipped with a solder application stamp 5, which serves for transfer of the solder paste 4 from a reservoir 6 onto the contact location 3. The solder application stamp 5 is moved by a positioning unit of the automated plant over the reservoir 6 and at least partially brought into the reservoir 6, so that a wetting of the solder application stamp 5 occurs. In such case, the solder application stamp 5 is pushed into the reservoir 6 only up to a predefined first force, for example, 1 N.

Following this, the solder application stamp 5 wetted with solder paste 4 is moved from the reservoir 6 to an earlier established position on the circuit board 1, where the substitute component 7 is to be secured. At the established, respectively predefined, position, the solder application stamp 5 is brought onto the circuit board side, contact location 3, for example, a copper pad, so that an applying, respectively transfer, of the solder paste 4 onto the contact location 3 occurs. In such case, the solder application stamp 5 is pushed with a predefined second force, for example, 0.7 N, onto the contact location 3. The positioning unit of the automated plant moves the solder application stamp 5 under force control, i.e. the force acting in the case of the setting, respectively pressing, of the solder application stamp 5 onto the contact location 3 is controlled by the positioning unit and should the force threaten to exceed a predefined (first and/or second) force, the setdown procedure is interrupted, respectively stopped.

Serving as reservoir 6 can be, for example, a dip tub, which has a defined depth. The solder paste 4 is introduced into the dip tub 6 and extra solder paste 4 removed by means of a doctor blade. In this way, a very reproducible amount of solder paste 4 can be placed in the reservoir 6, respectively the dip tub. Additionally, the reservoir, respectively the dip tub, 6 can have a nano coating, in order to enable easy release of the solder paste 4.

In the case, in which a plurality of contact locations 3 are to be provided with solder paste 4, the third step is correspondingly repeated multiple times or a solder application stamp 5 is used, which can simultaneously wet a number of contact locations 3.

In the fourth step, the circuit board 1 is populated with a substitute component 7 provided for the defective component 2. In such case, the multi-channel ring jet already applied in the first step is used, in order to release the substitute component 7 from a component supply tape and to bring it to the desired position on the circuit board 1.

In the fifth step, the substitute component 7 earlier placed on the circuit board 1 is soldered. In such case, the substitute component 7 placed on the preheated circuit board 1 is soldered onto the circuit board 1 by means of the hot air function of the multi-channel ring jet.

FIG. 2 is a schematic drawing illustrating the method steps. In such case, there is shown in FIG. 2a), by way of example, a circuit board 1 with three components, wherein the left component 2 is defective. This defective component 2 is removed according to the above described, first step. FIG. 2b) shows the circuit board 1, after the defective component 2 has been removed and the circuit board side, contact locations 3 cleaned. FIG. 2c) shows the circuit board 1, after the solder paste 4 has been applied on the contact locations 3. FIG. 2d) shows the circuit board 1 with the substitute component 7 soldered on.

Figure 3:
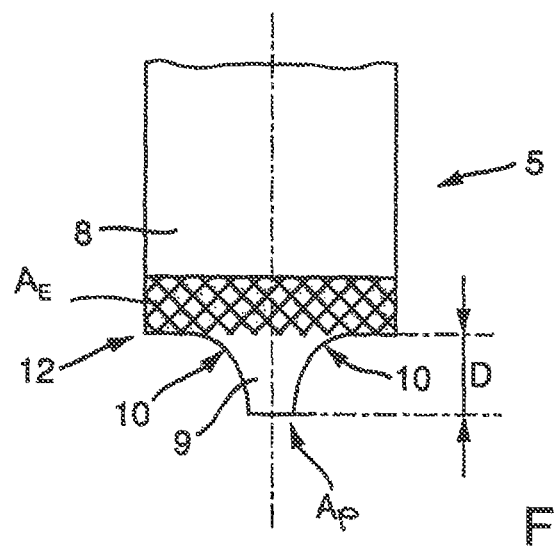
FIG. 3 is a schematic drawing of the solder application stamp of the invention.

FIG. 3 shows a schematic drawing of the solder application stamp 5 of the invention. This comprises a basic body 8 having an end area $A_E$. Extending out of the end area $A_E$ is a protrusion 9, which has a protrusion area $A_P$, which extends preferably essentially parallel to the end area $A_E$ of the basic body 8. Protrusion 9 is embodied in such a manner that it has in longitudinal section an at least sectionally concave contour 10 between the end area $A_E$ and the protrusion area $A_P$. The solder application stamp 5 collects the solder paste 4 via the concave contour 10, when the solder application stamp 5 is brought into a reservoir 6.

The maximum distance D of the projected area $A_P$ of the projection 9 from the end area $A_E$ of the basic body 8 lies in the range of 50-400 μm, preferably in the range of 80-150 μm. Found to be especially suitable is a maximum distance of about 300 μm.

The maximum distance D, in such case, is selected in such a manner that the end area $A_E$ of the basic body 8 is wetted with solder paste 4, when the solder application stamp 5 is introduced sufficiently into the reservoir 6 that the projected area $A_E$ contacts the floor of the reservoir 6. Such as already mentioned, there can serve as reservoir 6, for example, a dip tub, which, for example, has a depth in the range of 700 μm to 400 μm, preferably in the range of 400 μm to 200 μm, especially preferably in the range of 200 μm to 40 μm.

Figure 4:
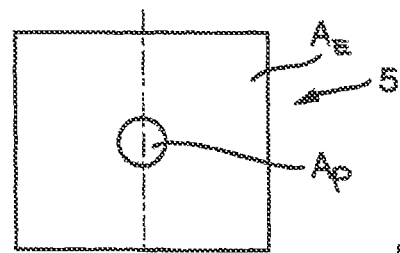
FIG. 4 is a schematic bottom view of the solder application stamp of the invention.

FIG. 4 shows a schematic drawing of the bottom view of the solder application stamp 5. The end area $A_E$ is square in such case. Other options include, however, also other geometric forms, such as, for example, a round cross section. Protrusion 9 and, thus, also the protrusion area $A_P$ are embodied in such a manner that these have a round cross section. The cross sectional area of the protrusion 9 steadily decreases, in such case, from the end area $A_E$ to the protrusion area $A_P$. Besides a round cross section, however, other options for geometric forms include especially rectangular or square cross-sectional shapes.

The cross sectional area of the essentially square basic body 8 lies in the range of 0.16 mm² to 0.64 mm², preferably in the range of 0.64 mm² to 1 mm², especially preferably in the range of 1 mm² to 2.25 mm².

The diameter of the projected area $A_P$ lies, as a function of contact location to be wetted, in the range of 300-180 μm, preferably in the range of 180-130 μm, especially preferably in the range of 130-50 μm.

Furthermore, the solder application stamp shown in FIG. 3 includes a hydrophobic coating (11), which is applied at least on a part of the surface of the basic body (8). As is evident from FIG. 3, the basic body is provided with the hydrophobic coating at least in the region adjoining the protrusion. The hydrophobic coating can, in such case, extend further over the entire basic body up to the side of the basic body facing away from the end area.

Furthermore, as brought out above, it advantageous when the floor of the reservoir, respectively the dip tub, likewise is provided with a hydrophobic coating.

A solder application stamp 5 constructed in such a manner can be used for repairing a circuit board 1 having at least one defective component 2, wherein the component 2 has at least one contact surface 3 having a maximum dimension of 500 μm to 200 μm, preferably a maximum dimension of 470 μm to 160 μm. In advantageous manner, the solder application stamp 5 can be used for repairing a circuit board 1 having at least one defective component 2, wherein the component 2 has at least two contact surfaces, wherein the contact locations 3 are separated from one another by 175 μm, preferably 150 μm, especially preferably 125 μm.

The invention claimed is:

1. A solder application stamp embodied to transfer solder paste from a reservoir to a contact location of a circuit board, comprising:
   a basic body having an end area; and
   at least one protrusion, which protrudes out of said end area and has a protrusion area, wherein:
   said at least one protrusion, in a longitudinal section has an at least sectionally concave contour between said end area and said protrusion area; and whereby said solder application stamp is embodied to generate solder paste dots of a diameter of 10 μm to 300 μm.

2. The solder application stamp as claimed in claim 1, wherein:

said protrusion area extends essentially parallel to said end area of said basic body.

3. The solder application stamp as claimed in claim 1, wherein:

said protrusion area is so embodied that the ratio of said end area to said protrusion area corresponds at most to a factor of 10, preferably a factor of 7.5 and especially preferably a factor of 5.

4. The solder application stamp as claimed in claim 1, wherein:

said protrusion area is so embodied that the ratio of said end area to said protrusion area corresponds at most to a factor of 35, preferably a factor of 21, and especially preferably a factor of 15.

5. The solder application stamp as claimed in claim 1, wherein:

the maximum distance between said end area and said projected area and, thus, the height of the projection lies in the range of 50-250 μm, preferably in the range of 80-150 μm.

6. The solder application stamp as claimed in claim 1, wherein:

the maximum distance between said end area and said projected area and, thus, the height of said projection lies in the range of 50-400 μm, preferably in the range of 180-220 μm, especially preferably in the range of 280-320 μm.

7. The solder application stamp as claimed in claim 1, wherein:

said projected area has a diameter in the range of 300-180 μm, preferably in the range of 180-130 μm, especially preferably in the range of 130-50 μm.

8. The solder application stamp as claimed in claim 1, further comprising:

a hydrophobic coating, which is applied on said basic body at least in a region adjoining the protrusion.

9. The use of a solder application stamp as claimed in claim 1, in an automated plant for repairing a circuit board, which has at least one defective component.

* * * * *